(12) United States Patent
Mei et al.

(10) Patent No.: US 9,528,665 B2
(45) Date of Patent: Dec. 27, 2016

(54) PHOSPHORS FOR WARM WHITE EMITTERS

(71) Applicant: LedEngin, Inc., San Jose, CA (US)

(72) Inventors: Zequn Mei, Fremont, CA (US); Truc Phoung Thi Vu, Fremont, CA (US)

(73) Assignee: LedEngin, Inc., San Jose, CA (US)

( * ) Notice: Subject to any disclaimer, the term of this patent is extended or adjusted under 35 U.S.C. 154(b) by 50 days.

(21) Appl. No.: 13/838,812

(22) Filed: Mar. 15, 2013

(65) Prior Publication Data

US 2014/0264402 A1 Sep. 18, 2014

(51) Int. Cl.
*H01L 33/26* (2010.01)
*F21K 99/00* (2016.01)
*H01L 33/50* (2010.01)

(52) U.S. Cl.
CPC . *F21K 9/56* (2013.01); *F21K 9/64* (2016.08); *H01L 33/504* (2013.01); *H01L 2933/0041* (2013.01)

(58) Field of Classification Search
CPC ............... H01L 33/502; H01L 33/508; H01L 2933/0041; H01L 27/322
USPC .............. 362/230–231, 235–242; 257/88, 89
See application file for complete search history.

(56) References Cited

U.S. PATENT DOCUMENTS

| | | |
|---|---|---|
| 5,742,120 A | 4/1998 | Lin |
| 5,959,316 A | 9/1999 | Lowery |
| 6,016,038 A | 1/2000 | Mueller |
| 6,252,254 B1 * | 6/2001 | Soules et al. ............... 257/89 |
| 6,307,160 B1 | 10/2001 | Mei et al. |
| 6,351,069 B1 | 2/2002 | Lowery et al. |
| 6,608,332 B2 | 8/2003 | Shimizu et al. |
| 6,614,179 B1 | 9/2003 | Shimizu et al. |
| 6,642,652 B2 | 11/2003 | Collins, III et al. |
| 6,680,128 B2 | 1/2004 | Mei |
| 6,791,116 B2 | 9/2004 | Takahashi et al. |

(Continued)

FOREIGN PATENT DOCUMENTS

| | | |
|---|---|---|
| EP | 1234140 B1 | 8/2002 |
| EP | 1610593 B1 | 12/2005 |

(Continued)

OTHER PUBLICATIONS

Megumi Yoshizawa, "Japanese Institute Prototypes White LED Composed of RGB Primary Colors," Nikkei Electronics, Mar. 25, 2008, p. 1.

(Continued)

*Primary Examiner* — Jerome Jackson, Jr.
*Assistant Examiner* — David Spalla
(74) *Attorney, Agent, or Firm* — Kilpatrick Townsend & Stockton LLP

(57) ABSTRACT

A method for fabricating light-emitting devices includes obtaining a plurality of light-emitting diode (LED) chips fabricated to emit blue light and preparing a phosphor-containing material comprising a matrix material having dispersed therein a mixture of a red phosphor and a green phosphor in a fixed ratio to each other. The method also includes disposing different thicknesses of the phosphor-containing material on different ones of the LED chips. The fixed ratio is chosen such that LED chips having different thicknesses of the phosphor-containing material emit light characterized by different points along the Planckian locus in a CIE chromaticity diagram.

17 Claims, 6 Drawing Sheets

(56) References Cited

U.S. PATENT DOCUMENTS

| | | | |
|---|---|---|---|
| 6,828,170 B2 | 12/2004 | Roberts et al. | |
| 6,833,565 B2 | 12/2004 | Su et al. | |
| 6,967,447 B2 | 11/2005 | Lim et al. | |
| 7,045,375 B1 | 5/2006 | Wu et al. | |
| 7,064,353 B2 | 6/2006 | Bhat | |
| 7,066,623 B2 | 6/2006 | Lee et al. | |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 7,473,933 B2 | 1/2009 | Yan | |
| 7,670,872 B2 | 3/2010 | Yan | |
| 7,772,609 B2 | 8/2010 | Yan | |
| 8,529,791 B2 | 9/2013 | Wu | |
| 8,598,809 B2 | 12/2013 | Negley et al. | |
| 2001/0015778 A1 | 8/2001 | Murade | |
| 2001/0050371 A1 | 12/2001 | Odaki | |
| 2002/0015013 A1 | 2/2002 | Ragle | |
| 2002/0079837 A1 | 6/2002 | Okazaki | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 | 7/2003 | Yamanaka et al. | |
| 2003/0227249 A1 | 12/2003 | Mueller et al. | |
| 2003/0230977 A1 | 12/2003 | Epstein | |
| 2004/0004437 A1 | 1/2004 | Shimizu et al. | |
| 2004/0051111 A1 | 3/2004 | Ota et al. | |
| 2004/0079957 A1 | 4/2004 | Andrews et al. | |
| 2004/0102061 A1 | 5/2004 | Watanabe | |
| 2004/0126918 A1 | 7/2004 | Kurahashi et al. | |
| 2004/0173810 A1 | 9/2004 | Lin et al. | |
| 2004/0201025 A1 | 10/2004 | Barnett et al. | |
| 2004/0257496 A1 | 12/2004 | Sonoda | |
| 2005/0035364 A1 | 2/2005 | Sano et al. | |
| 2005/0062140 A1 | 3/2005 | Leung et al. | |
| 2005/0093146 A1 | 5/2005 | Sakano | |
| 2005/0145872 A1 | 7/2005 | Fang et al. | |
| 2005/0179376 A1 | 8/2005 | Fung et al. | |
| 2005/0199900 A1 | 9/2005 | Lin et al. | |
| 2005/0224830 A1 | 10/2005 | Blonder et al. | |
| 2005/0253242 A1 | 11/2005 | Costello et al. | |
| 2005/0270666 A1 | 12/2005 | Loh et al. | |
| 2005/0286131 A1 | 12/2005 | Saxena et al. | |
| 2006/0012299 A1 | 1/2006 | Suehiro et al. | |
| 2006/0063287 A1 | 3/2006 | Andrews | |
| 2006/0082296 A1 | 4/2006 | Chua et al. | |
| 2006/0082679 A1 | 4/2006 | Chua et al. | |
| 2006/0091788 A1 | 5/2006 | Yan | |
| 2006/0097385 A1 | 5/2006 | Negley | |
| 2006/0170332 A1 | 8/2006 | Tamaki et al. | |
| 2006/0284209 A1 | 12/2006 | Kim et al. | |
| 2007/0194341 A1 | 8/2007 | Chang et al. | |
| 2007/0223219 A1 | 9/2007 | Medendorp et al. | |
| 2007/0274098 A1 | 11/2007 | Wheatley et al. | |
| 2007/0278512 A1 | 12/2007 | Loh et al. | |
| 2008/0258602 A1* | 10/2008 | Masuda et al. | 313/487 |
| 2008/0308825 A1 | 12/2008 | Chakraborty et al. | |
| 2009/0014741 A1* | 1/2009 | Masuda | C04B 35/22 257/98 |
| 2010/0060185 A1 | 3/2010 | Van Duijneveldt | |
| 2010/0065864 A1* | 3/2010 | Kessels et al. | 257/89 |
| 2010/0091499 A1 | 4/2010 | Jiang et al. | |
| 2010/0155755 A1 | 6/2010 | Dong | |
| 2010/0259930 A1 | 10/2010 | Van | |
| 2010/0308712 A1 | 12/2010 | Liu | |
| 2011/0102706 A1* | 5/2011 | Oshio | H01L 25/0753 349/61 |
| 2012/0286669 A1 | 11/2012 | Van | |
| 2012/0286699 A1 | 11/2012 | Van | |
| 2013/0049021 A1* | 2/2013 | Ibbetson et al. | 257/88 |
| 2013/0075769 A1 | 3/2013 | Van | |
| 2013/0221873 A1 | 8/2013 | Weaver | |
| 2014/0042470 A1* | 2/2014 | Hsu | H01L 33/505 257/98 |
| 2014/0210368 A1 | 7/2014 | Lee | |
| 2016/0007419 A1 | 1/2016 | Lee | |

FOREIGN PATENT DOCUMENTS

| | | |
|---|---|---|
| JP | 2000-349346 | 12/2000 |
| JP | 2000-349347 | 12/2000 |
| JP | 2001-057445 | 2/2001 |
| JP | 2002-185046 | 6/2002 |
| JP | 2004-241704 | 8/2004 |
| JP | 2004-253404 | 9/2004 |
| KR | 102010092686 | 2/2012 |

OTHER PUBLICATIONS

Notice of Allowance for U.S. Appl. No. 13/106,810, mailed Mar. 5, 2013, 9 pages.

Kading, O.W., "Thermal Conduction in Metallized Silicon-Dioxide Layers on Silicon," Applied Physics, Sep. 1994, vol. 65, No. 13, pp. 1629-1631.

"Solvent Soluble Polyimide with High Transparency and High Tg: HOP-400, 500," Hitachi Cable Review, Aug. 2003, No. 22, p. 78.

Yan, Xiantao, "Two Test Specimens for Determining the Interfacial Fracture Toughness in Flip-Chip Assemblies," Jun. 1998, Transactions of the ASME, vol. 120, pp. 150-155.

Yan, Xiantao, "Analysis Based Design Guidelines for Metal Runner and Passivation Layers in IC Packaging," DELPHI Automotive Systems, Analytical Engineering Conference, May 2000, pp. 1-4.

LZC-03MCOO Data Sheet Rev 5.2—Mar. 12, 2013) downloaded from URL <https ://web.archive.org/web/20 140707084 758/http :/ /www .ledeng in .com/files/products/LZC/LZC-03MCOO. pdf> on Feb. 4, 2016.

Joos, et al. Journal of Solid State Lighting 2014, 1 :6 pp. 2-16.

Wood, M., "CRI and the Color Quality Scale, Part 2", Out of the Wood, Spring 2010 downloaded from URL<http://www.ianiro.com/media/formato2/ianiro_ 515.pdf> on Feb. 4, 2016.

Xie, Rong-Jun; Hirosaki, Naoto; Li, Vuanqiang; Takeda, Takashi. 2010. "Rare-Earth Activated Nitride Phosphors: Synthesis, Luminescence and Applications." Materials 3, No. 6: 3777-3793.

XR6436-03 Data Sheet downloaded from URL<http://www.intematix.com/uploads/phosphor-datasheets/nitrides/XR6436-03.pdf> on Feb. 4, 2016.

G1758 Data Sheet downloaded from URL<http://www.intematix.com/uploads/phosphor-datasheets/Silicate/G1758.pdf> on Feb. 4, 2016.

Bailey, S, "Why the LED R9 value isn't important" Mar. 28, 2013, downloaded from URL<http://www.leapfroglighting.com/whythe-led-r9-value-isnt-important!> on Feb. 4, 2016.

Near, A., "Seeing Beyond CRI", LED Testing and Application, 2011, downloaded from URL<http://www.ies.org/Ida/HotTopics/LED/4.pdf> on Feb. 4, 2016.

Consideratios for Blending LED Phosphors, Applications Note, downloaded from URL<http://www.intematix.com/uploads/application%20notes/PhosphorBiendingAppNote1 0Jan2013.pdf> on Feb. 4, 2016.

Gallery White. Sep. 20, 2013, downloaded from URL<https://web.archive.org/web/20130920230548/http://www.ledengin.com/products/gallerywhite> on Feb. 4, 2016.

Intermatix Patents Red Nitride Phosphor for LED Lighting, EETimes, Dec. 18, 2013 downloaded from X U R L <http:/ /led 1 ig hti ng -eeti mes .co m/e n/i ntem atix-pate nts-red-n itride-p hosp ho r-for -ledlighting.html?cmp_id=7&news_id=222908963> on Feb. 4, 2016.

Office Action mailed Feb. 11, 2016 in U.S. Appl. No. 14/634,348, 22 pages.

* cited by examiner

PHOSPHORS FOR WARM WHITE EMITTERS

CROSS-REFERENCES TO RELATED APPLICATIONS

This application is related to U.S. patent application Ser. No. 13/106,810, filed May 12, 2011, commonly owned and incorporated by reference in its entirety herein for all purposes.

BACKGROUND OF THE INVENTION

The present invention relates in general to light-emitting devices based on light-emitting diodes (LEDs) and in particular to methods devices for LED chips having phosphor-containing material formed thereon.

With the incandescent light bulb producing more heat than light, the world is eager for more efficient sources of artificial light. LEDs are a promising technology and are already widely deployed for specific purposes, such as traffic signals and flashlights. However, the development of LED-based lamps for general illumination has run into various difficulties. Among these is the difficulty of mass-producing lamps that provide a consistent color temperature.

As is known in the art, not all white light is the same. The quality of white light can be characterized by a color temperature, which ranges from the warm (slightly reddish or yellowish) glow of standard tungsten-filament light bulbs to the cool (bluish) starkness of fluorescent lights. Given existing processes for LED manufacture, mass-producing white LEDs with a consistent color temperature has proven to be a challenge.

Various solutions have been tried. For example, white LEDs can be binned according to color temperature and the LEDs for a particular lamp can be selected from the desired bin. However, the human eye is sensitive enough to color-temperature variation that a large number of bins is required, with the yield in any particular bin being relatively low.

Therefore, a more efficient method for producing white light-emitting devices is highly desirable.

BRIEF SUMMARY OF THE INVENTION

Embodiments of the present invention relate generally to apparatus and techniques for light-emitting devices based on light-emitting diodes (LEDs). Particular embodiments are adapted for light-emitting devices having LED chips with phosphor-containing material formed thereon, such that light emitted from these light-emitting devices is characterized by a desirable distribution. The light-emitting devices have selected combinations of green and red phosphors disposed over blue LEDs. More desirable light distribution can be obtained. For example, the distribution of light can be made to cluster along the Planckian locus in a chromaticity diagram. As a result, the yield of useful LEDs can be increased.

According to some embodiments of the present invention, a method for fabricating light-emitting devices includes obtaining a plurality of light-emitting diode (LED) chips fabricated to emit blue light and preparing a phosphor-containing material comprising a matrix material having dispersed therein a mixture of a red phosphor and a green phosphor in a fixed ratio to each other. The method also includes disposing different thicknesses of the phosphor-containing material on different ones of the LED chips. The fixed ratio is chosen such that LED chips having different thicknesses of the phosphor-containing material emit light characterized by different points along the Planckian locus in a CIE chromaticity diagram. In some embodiments, the fixed ratio is chosen such that LED chips having different thicknesses of the phosphor-containing material emit light characterized by an ellipse having a long axis substantially parallel to the Planckian locus in a CIE chromaticity diagram.

In an embodiment of the above method, the green phosphor has a peak emitting wavelength that is less than 550 nm. In another embodiment, the green phosphor has a peak emitting wavelength that is less than 525 nm. In yet another embodiment, the green phosphor has a peak emitting wavelength in a range from about 515 nm to about 518 nm. In some embodiments, the phosphor-containing material has about 60-80 units of red phosphor and 390-430 units of green phosphor. In alternative embodiments, the fixed ratio is a ratio of about one part of red phosphor to 5-7 parts of green phosphor by weight. In another embodiment, the method also includes combining two or more of the LED chips covered with different thicknesses of the phosphor-containing material to make an LED emitter, which emits light characterized by a point along the Planckian locus in the CIE chromaticity diagram.

According to some embodiments of the present invention, a plurality of light emitting devices includes a plurality of light-emitting-diode (LED) chips configured to emit blue light, wherein different ones of the LED chips have different thicknesses of a phosphor-containing material formed thereon. The phosphor-containing material includes a matrix material having dispersed therein a mixture of a red phosphor and a green phosphor in a fixed ratio to each other. A distribution of light emitted from the plurality of LED chips having different thicknesses of the phosphor-containing material is characterized by an ellipse having a long axis substantially parallel to the Planckian locus in a CIE chromaticity diagram. In an embodiment, the green phosphor has a peak emitting wavelength that is 525 nm or less. In another embodiment, the green phosphor has a peak emitting wavelength in a range from about 515 nm to about 518 nm. In some embodiments, the fixed ratio is a ratio of about one unit of red phosphor to 5-7 units of green phosphor.

According to some embodiments, a plurality of light emitting devices includes a first light-emitting device having a first amount of a wavelength-conversion material overlying a first light-emitting-diode (LED) chip configured to emit light of a first color, and a second light-emitting device having a second amount of the wavelength-conversion material overlying a second light-emitting-diode (LED) chip configured to emit light of the first color, the second amount being different from the first amount. The wavelength-conversion material includes a matrix material having dispersed therein a mixture of a first phosphor and a second phosphor in a fixed ratio to each other. The fixed ratio is chosen such that the first light-emitting device and the first light-emitting device emit light characterized by different points along the Planckian locus in a CIE chromaticity diagram.

In some embodiments, the above plurality of light emitting devices also includes a third light-emitting device including a third amount of the phosphor-containing material overlying a third light-emitting-diode (LED) chip configured to emit light of the first color, the third amount being different from the first amount and the second amount. Light from the third light-emitting device is characterized by a third point along the Planckian locus in the CIE chromaticity diagram. In some embodiments, in the first color is blue, the first phosphor is a red phosphor, and the second phosphor is a green phosphor. In an embodiment, the green phosphor has a peak emitting wavelength that is less than 550 nm. In another embodiment, the green phosphor has a peak emitting wavelength that is less than 525 nm. In some embodiment, the fixed ratio is a ratio of about one unit of red phosphor to 5-7 units of green phosphor.

The following detailed description together with the accompanying drawings will provide a better understanding of the nature and advantages of the present invention.

DETAILED DESCRIPTION OF THE INVENTION

Embodiments of the present invention relate generally to apparatus and techniques for light-emitting devices based on light-emitting diodes (LEDs). Particular embodiments are adapted for light-emitting devices having LED chips with phosphor-containing material formed thereon, such that light emitted from these light-emitting devices is characterized by a desirable distribution. The light-emitting devices have selected combinations of green and red phosphors disposed over blue LEDs. More desirable light distribution can be obtained. For example, the distribution of light can be made to cluster along the Planckian locus in a chromaticity diagram. As a result, the yield of useful LEDs can be increased.

Figure 1:
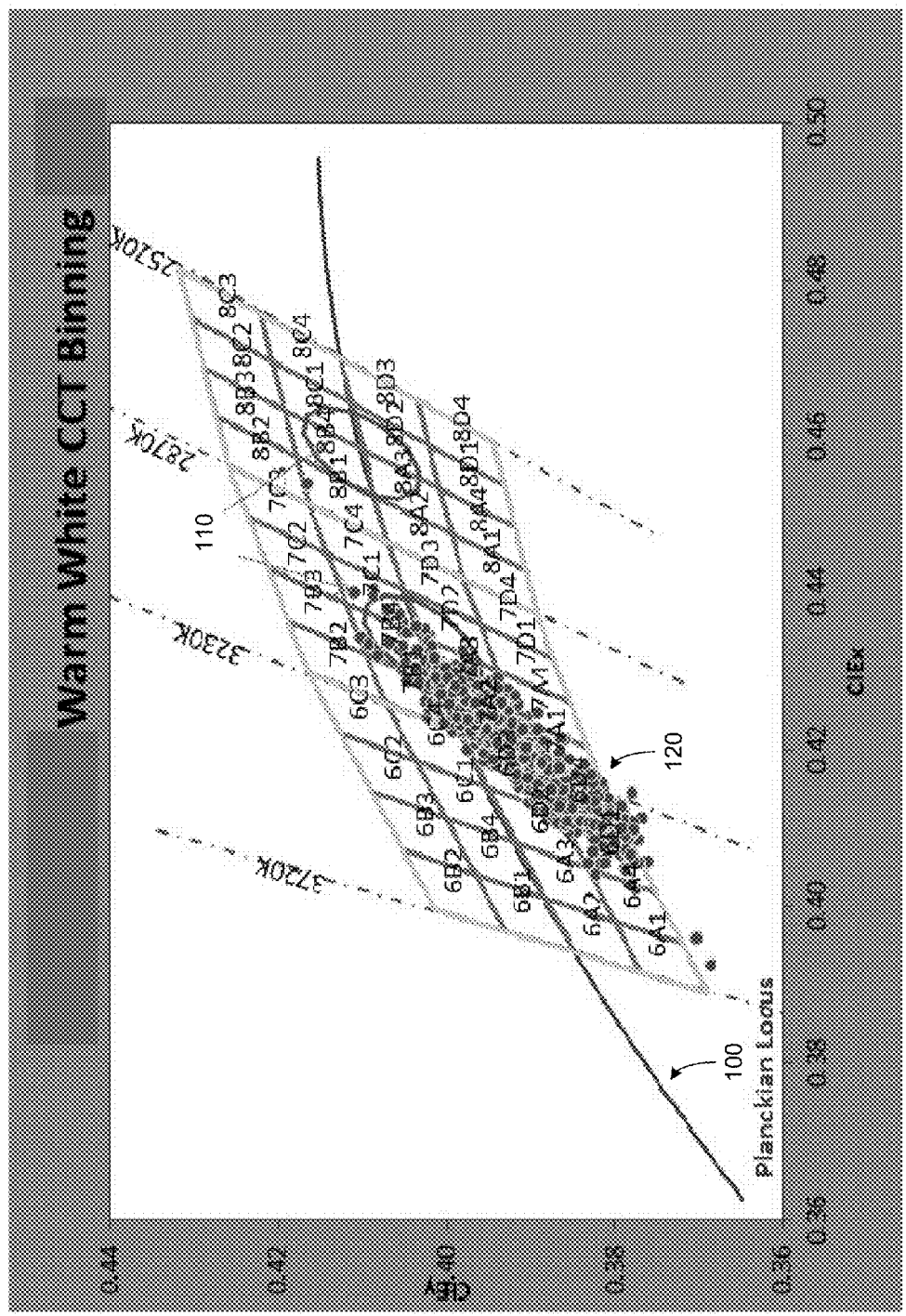
FIG. 1 shows a portion of a chromaticity diagram used for characterization of white light.

LED emitters are often characterized in a chromaticity diagram specified by the two chromaticity coordinates known as CIEx and CIEy. FIG. 1 shows a portion of the chromaticity diagram often used for characterization of white light, for example, with CIEx between 0.36 to 0.50 and CIEy between 0.36 and 0.44. The colors of warm white light emitters are sorted in bins between the range of color temperatures between 2570° K and 3720° K in FIG. 1. Also shown is the Planckian locus 100, which is the path of the color of a black body as its temperature changes. Also shown in FIG. 1 are two ellipses 110 along the Plackian locus. These ellipses are known as MacAdam ellipses which refers to the region on a chromaticity diagram which contains all colors which are indistinguishable to the average human eye from the color at the center of the ellipse. The two MacAdam ellipses 110 in FIG. 1 represent examples of desirable warm white light LED emitter light distributions. However, these distributions are difficult to achieve using conventional manufacturing methods.

A conventional method for making warm while LED emitters is to cover blue LED chip with a mixture of yellow and red phosphors. Yellow and red lights are produced as the results of the yellow and red phosphors being excited by the blue light. The combination of the blue light with the red and yellow lights forms a warm white color. The inclusion of the red phosphor is necessary for not only adjusting color but also improving color rendering index (CRI) and color parameters such R9 which is light quality referenced to a red color. However, when a mixture of red and yellow phosphor powders and a carrier liquid (often silicone) is disposed over the blue chips surface by dispensing or other methods, the dispensed volume can vary, resulting in color scattering. A typical example of color scattering is shown in FIG. 1 in the shape of an elongated ellipse 120. It can be seen that the long axis of the ellipse is not parallel to Plankian locus 100, also known as the Black Body Line (BBL). Rather, the long axis forms an angle with the BBL, much different from the desirable distribution along the Planckian locus.

Figure 2:
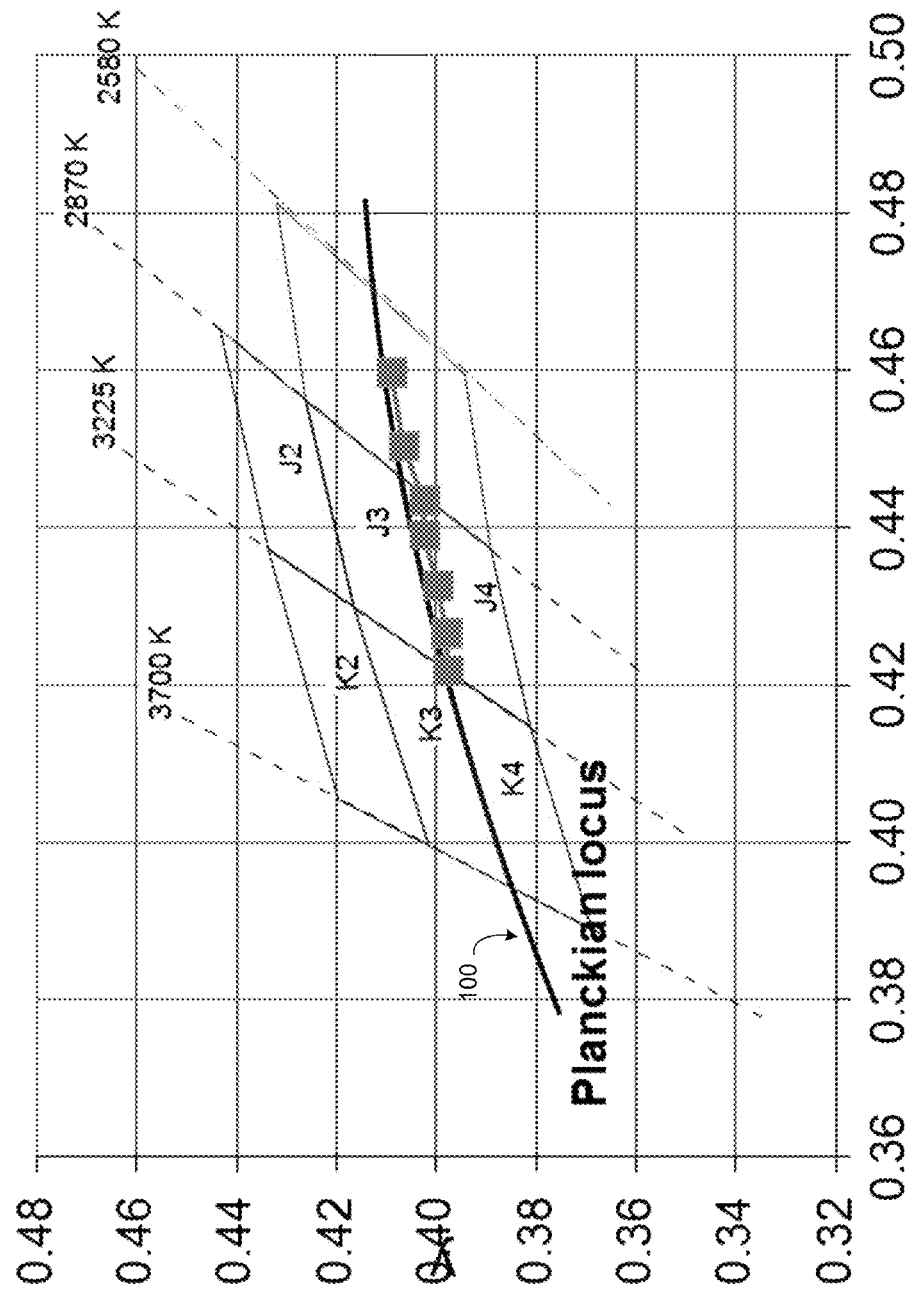
FIG. 2 shows a portion of a chromaticity diagram illustrating a distribution of light from a plurality of light-emitting devices according to embodiments of the present invention.

Embodiments of the present invention provide methods for forming LED emitters for which, when the dispensed quantity of the phosphor varies, the color variation of the emitters are distributed along the BBL or the Planckian Locus, as shown in FIG. 2, in which seven data points represent light from different LEDs formed according to embodiments of the invention. It can be seen that these data points extend along the Plankian locus 100.

Figure 3:
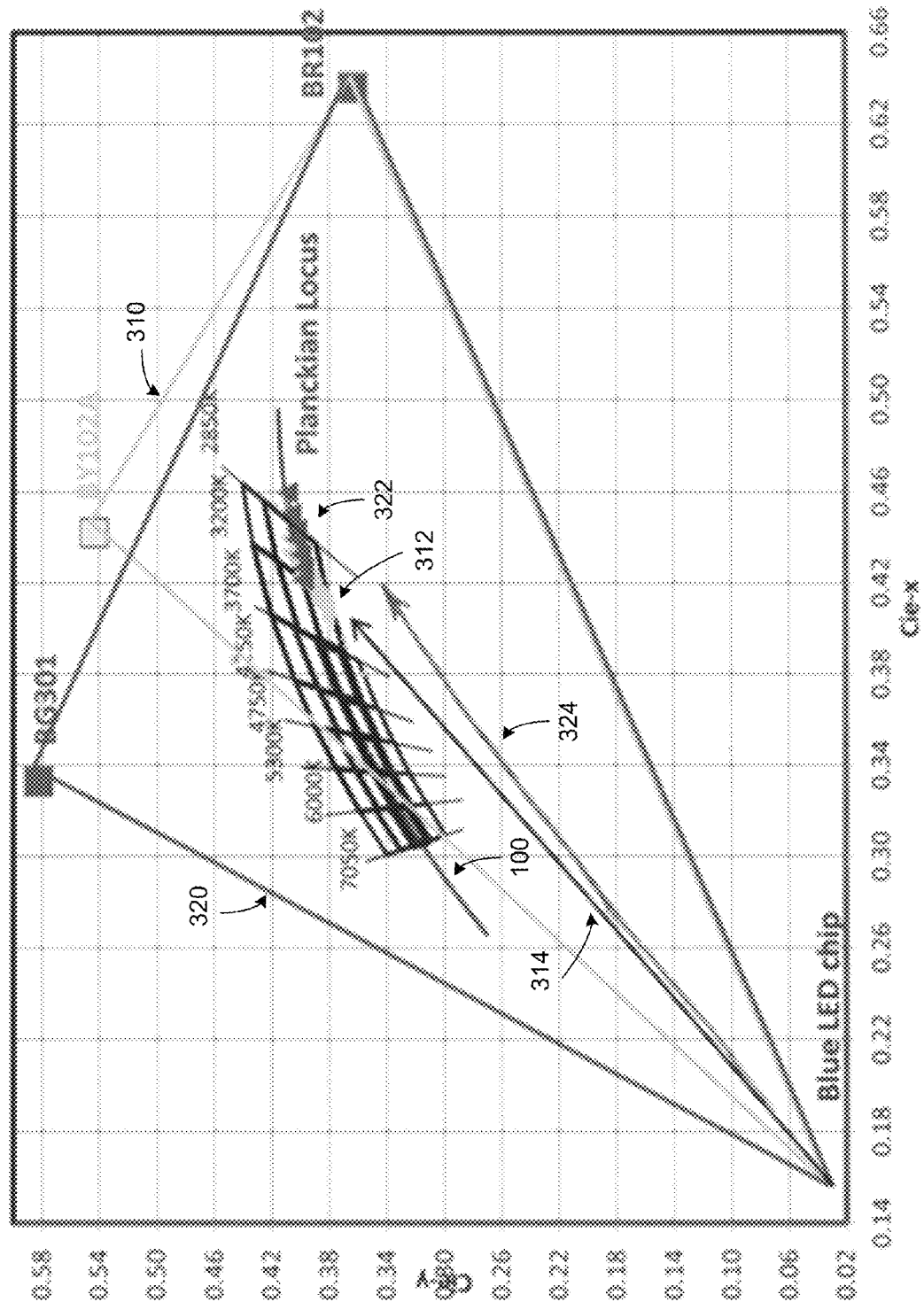
FIG. 3 shows a portion of a chromaticity diagram illustrating a method for forming a plurality of light-emitting devices according to embodiments of the present invention.
Figure 4:
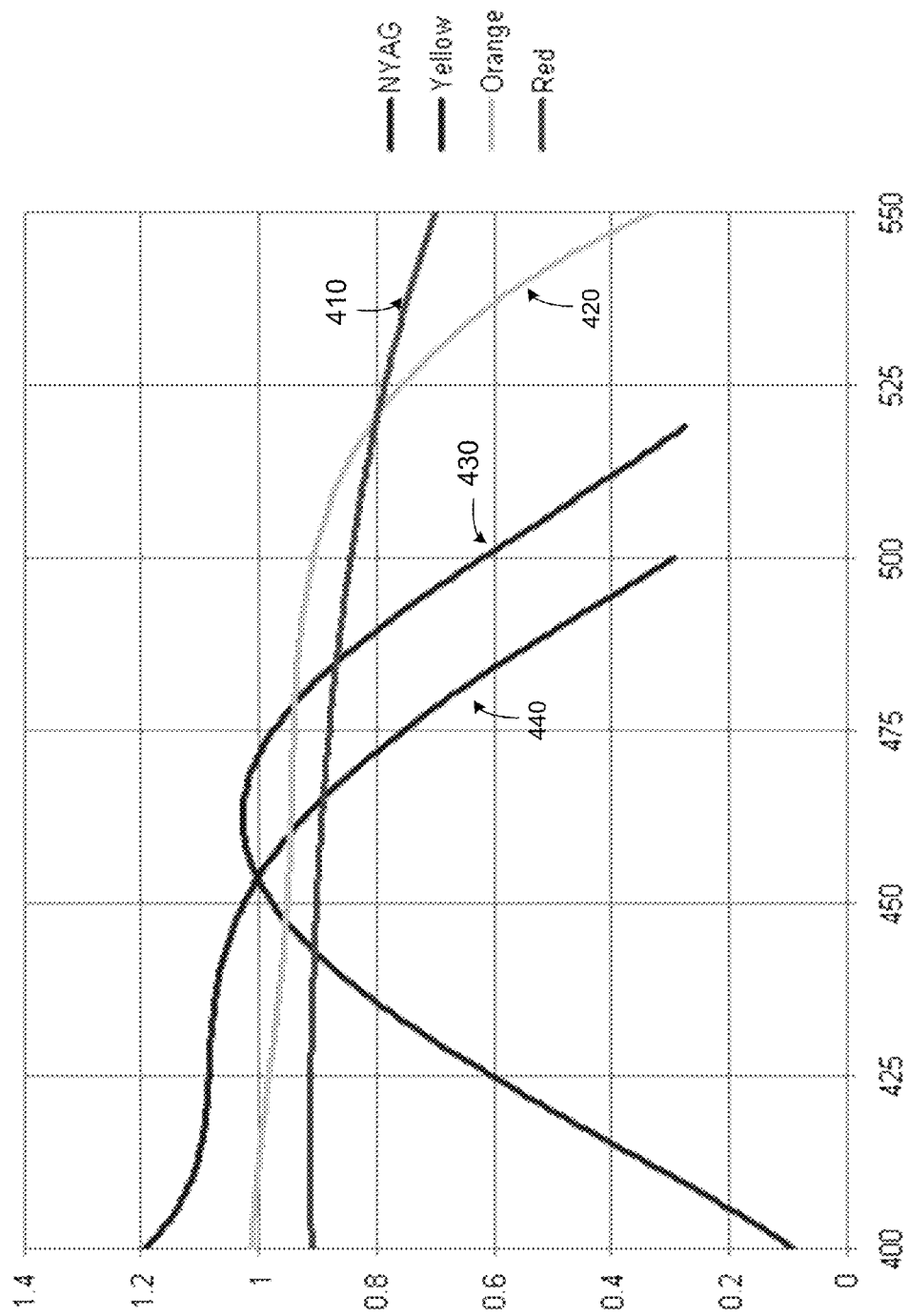
FIG. 4 shows relative intensity of emitted light with different phosphors as functions of the wavelength of the excitation light according to embodiments of the present invention.

The method can be explained with reference to FIGS. 3 and 4. As shown in the chromaticity diagram of FIG. 3, a triangle 310 shows the conventional method for forming a warm white light emitter with yellow (BY102A) and red (BR102) phosphors over blue LED chips. The resulted color distribution 312 forms an angle with the Planckian Locus (or BBL) 100. In FIG. 3, triangle 320 shows a method according to embodiments of the present invention using a green phosphor (BG301) and a red phosphor (BR102) over the blue LED chips. The resulted color distribution 322 extends along a line that is parallel to BBL 100.

FIG. 3 can be understood as follow. Blue light excites both the red and yellow phosphors, which emit yellow and red lights, respectively. The combination of the blue, yellow, and red lights yields colors inside triangle 310 shown in FIG. 3. For the same ratio of the yellow phosphor to red phosphor, as the dispensed phosphor quantity increases, the color changes along a straight arrowed line 314 shown in FIG. 3. However, the yellow light also excites the red phosphor; as the dispensed phosphor quantity increases, the color starts to deviate from the straight arrowed line and follow a curved line 312, as shown in FIG. 3.

In embodiments of the present invention, the red light is increased to bend the color distribution more toward the red corner, to match it with the BBL. To achieve that, the yellow phosphor is replaced with a green phosphor. According to embodiments of the invention, the green light from the green phosphor has a higher excitation efficiency of generating red light through a red phosphor. This can be seen in FIG. 4, where the x-axis is the wavelength (in nm) of the excitation light to the phosphors, and the y-axis is the relative intensity of the emitting light from the excited phosphors. It is noted that for the red phosphor, the relative emitting light intensity is as high as 0.9 when the excitation wavelength is in the range of 400 nm to 450 nm, which is in the blue light range. However, the relative emitting light intensity is lower, at 0.7, for 550 nm (yellowish green) excitation light. But it increases to 0.8 as the excitation wavelength changes from the 550 nm to 525 nm which is in the range of green color. In contrast, the yellow phosphor can produce high emitting light when exited by blue light in the 400 to 450 nm wavelength range, but the efficiency drops substantially at 500 nm or higher. The inventors of this application have observed that the red phosphor responds more strongly to a green excitation light (525 nm) than yellow light (550 nm). Therefore, in an emitter with a blue LED and a mixture of green and red phosphors, as the amount of green phosphor is increased, more green light is produced which, passing through the red phosphor, causes more red light to be generated. Therefore, by properly selecting the ratio of green phosphor and red phosphor, the output light can be made to track the Plankian locus, which bends toward the red corner in the CIE chromaticity diagram. In addition, to compensate for the green phosphor, which is farther way from the Planckian locus than the yellow phosphor, the ratio of the red phosphor to green phosphor is selected accordingly. The red phosphor content tends to bend the distribution towards the red corner and more parallel to the Planckian locus, as shown in FIG. 3.

For the same ratio of the green phosphor to red phosphor, as the dispensed phosphor quantity increases, the color would initially change along a straight arrowed line 324 shown in FIG. 3. However, as the dispensed phosphor quantity increases, the actions of the green and red phosphors cause the color of the LEDs to deviate from the straight arrowed line and follow a curved line 322 along the Planckian locus, as shown in FIG. 3.

Figure 5:
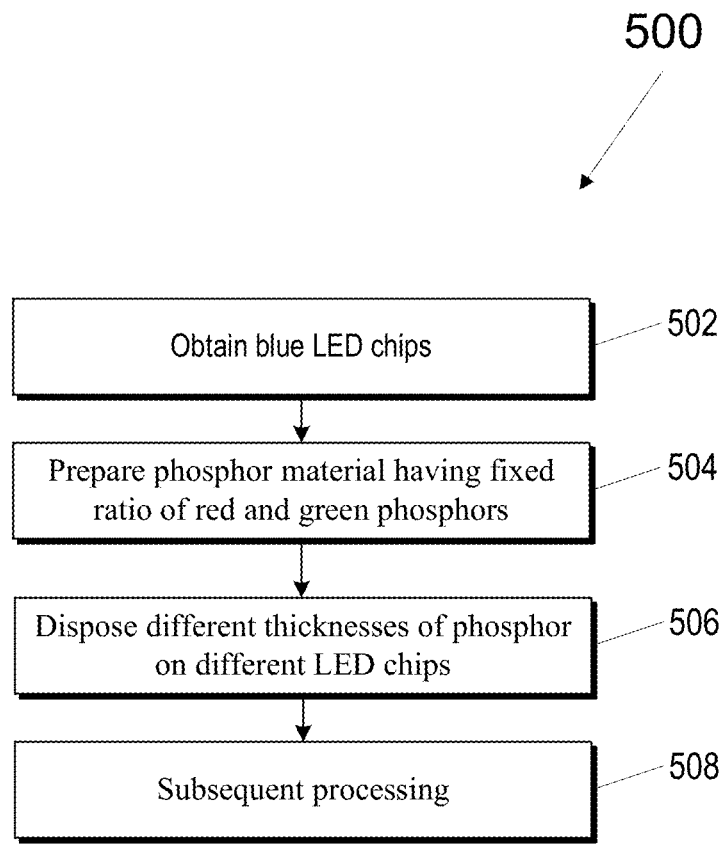
FIG. 5 is a simplified flowchart that illustrates a method for fabricating light-emitting devices according to embodiments of the invention.

FIG. 5 is a simplified flowchart that illustrates a method 500 for fabricating light-emitting devices according to embodiments of the present invention. As shown in FIG. 5, method 500 includes obtaining a plurality of light-emitting diode (LED) chips fabricated to emit blue light (step 502), and preparing a phosphor-containing material comprising a matrix material, such as silicone, having dispersed therein a mixture of a red phosphor and a green phosphor in a fixed ratio to each other (step 504). The method also includes disposing different thicknesses of the phosphor-containing material on different ones of the LED chips (step 506), wherein the fixed ratio is chosen such that LED chips having different thicknesses of the phosphor-containing material emit light characterized by different points along the Planckian locus in a CIE chromaticity diagram. In certain embodiments, the fixed ratio is chosen such that LED chips having different thicknesses of the phosphor-containing material emit light characterized by an ellipse having a long axis substantially parallel to the Planckian locus in a CIE chromaticity diagram.

Depending on the embodiments, the method can include various subsequent processing steps (508). For example, the LED chips covered with the phosphor-containing material may be tested for color temperature binning and can be assembled to form an LED emitter, including a substrate and a lens. Alternatively, further comprising may combine two or more of the LED chips covered with different thicknesses of the phosphor-containing material to make an LED emitter, which emits light characterized by a point along the Planckian locus in the CIE chromaticity diagram. Methods for combining multiple LED chips to form light emitters are described in U.S. patent application Ser. No. 13/106,810, filed 12, 2011, commonly owned and incorporated by reference in its entirety herein for all purposes.

In some embodiments, the green phosphor has a peak emitting wavelength that is less than 550 nm. In a specific embodiment, the green phosphor has a peak emitting wavelength that is less than 525 nm. In another embodiment, the green phosphor has a peak emitting wavelength in a range from about 515 nm to about 518 nm. In embodiments of the invention, the red phosphor is selected with strong absorption at the green phosphor wavelength. Example of the green phosphor include BG-301 (MCC) with peak emitting wavelength of 515-518 nm, and GAL525 (Internetix) with peak emitting wavelength of 516 nm. Other example of the green phosphor are BG-320 or BG220 (MCC). Examples of the red phosphor are BR102 and BR101 (MCC). Other examples of red phosphor includes BY101, BY102, or BY103 by MCC. In some embodiments, the matrix material in the phosphor-containing material includes a silicone material, e.g., KER2500 made by ShinEtsu. In some embodiments, the phosphor-containing material includes about 390-430 units of green phosphor to 60-80 units of red phosphor. In other embodiments the relative ratio of green phosphor to red phosphor is about 5-7 parts of green phosphor to one part of red phosphor by weight.

According to embodiments of the invention, varying the relative ratio of the green phosphor to red phosphor in a light-emitting device described above causes the light distribution to shift parallelly relative to the Plankian locus in the chromaticity diagram. Therefore, a desirable light distribution can be obtained by selecting a ratio of green to red phosphors and vary the quality of phosphors disposed on the LED chips.

There are many advantages of using the method described above to make warm white light-emitting devices. For example, the optical parameters R9 and CRI are usually higher with the green and red phosphors than with the yellow and red phosphors. Using the method described above with green and red phosphors at a fixed ratio, different CCTs can be obtained by varying the dispensed quantity or the thickness of the phosphor-containing material, since the light distribution is along the Planckian locus. In contrast, with the yellow and red phosphor recipe, different CCTs of the warm white requires different ratios of the yellow phosphor to the red phosphor. In other words, a different batch of phosphor-containing material needs to be prepared for a different CCT, which is undesirable.

Figure 6:
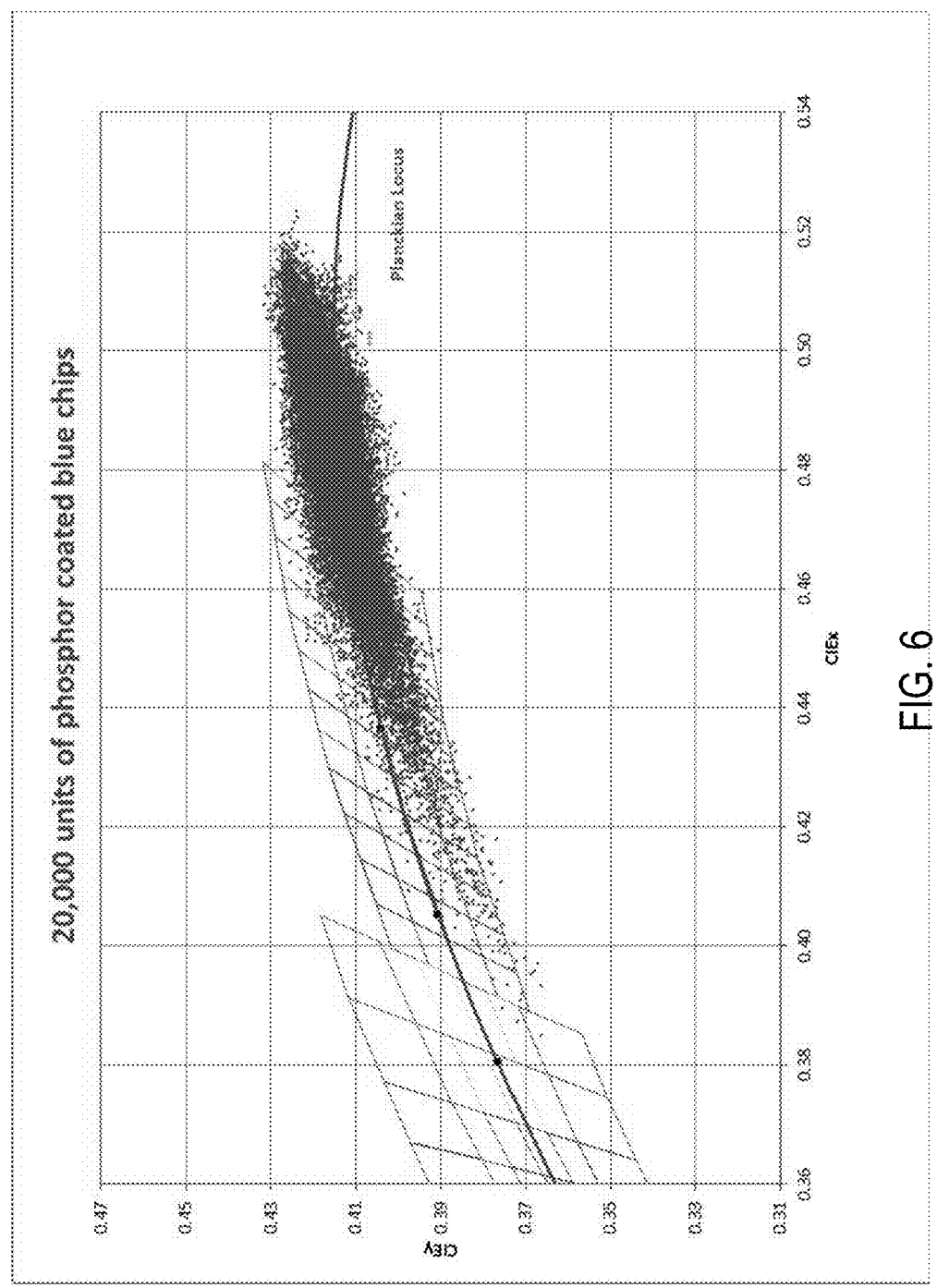
FIG. 6 shows a portion of a chromaticity diagram illustrating light distribution of light-emitting devices fabricated according to an embodiment of the present invention.

FIG. 6 shows a portion of a chromaticity diagram illustrating light distribution of light-emitting devices fabricated according to an embodiment of the present invention. In FIG. 6, each data point in the chromaticity diagram represent one of 20,000 LED chips coated with different quantities of a phosphor-containing material made according to the method described above. The light-emitting-diode (LED) chips are configured to emit blue light. The phosphor-containing material includes a matrix material, such silicone, having dispersed therein a mixture of a red phosphor and a green phosphor in a fixed ratio to each other. It can be seen in FIG. 6 that the distribution of light emitted from the plurality of LED chips is characterized by an ellipse having a long axis substantially parallel to the Planckian locus in a CIE chromaticity diagram. The light distribution extends a range of CCT of about 2600K to 4000K using different thicknesses of the same phosphor-containing material with a fixed ratio of red and green phosphors.

In addition, the manufacturing process often causes unavoidable variations in the thickness of phosphor disposed on top of the LED chip. Using the method described above, the resulting LED chips still emit light that follow the Planckian locus. Further, two or more of the LED chips covered with different thicknesses of the phosphor-containing material can be combined to make an LED emitter, which emits light characterized by a point along the Planckian locus in the CIE chromaticity diagram. As a result, the yield of usable light-emitting devices can be increased. The color rendering performance can be improved. For example, the target of CRI at 90 is easier to achieve using the methods describe above than conventional methods, which often struggle to reach the target of CRI 80.

According to some embodiments of the present invention, a plurality of light emitting devices includes a plurality of light-emitting-diode (LED) chips configured to emit blue light, wherein different ones of the LED chips have different thicknesses of a phosphor-containing material formed thereon. The phosphor-containing material includes a matrix material having dispersed therein a mixture of a red phosphor and a green phosphor in a fixed ratio to each other. A distribution of light emitted from the plurality of LED chips having different thicknesses of the phosphor-containing material is characterized by an ellipse having a long axis substantially parallel to the Planckian locus in a CIE chromaticity diagram. In an embodiment, the green phosphor has a peak emitting wavelength that is 525 nm or less. In another embodiment, the green phosphor has a peak emitting wavelength in a range from about 515 nm to about 518 nm. In some embodiments, the fixed ratio is a ratio of about one unit of red phosphor to 5-7 units of green phosphor.

According to some embodiments, a plurality of light emitting devices includes a first light-emitting device having a first amount of a wavelength-conversion material overlying a first light-emitting-diode (LED) chip configured to emit light of a first color, and a second light-emitting device having a second amount of the wavelength-conversion material overlying a second light-emitting-diode (LED) chip configured to emit light of the first color, the second amount being different from the first amount. The wavelength-conversion material includes a matrix material having dispersed therein a mixture of a first phosphor and a second phosphor in a fixed ratio to each other. The fixed ratio is chosen such that the first light-emitting device and the first light-emitting device emit light characterized by different points along the Planckian locus in a CIE chromaticity diagram.

In some embodiments, the above plurality of light emitting devices also includes a third light-emitting device including a third amount of the phosphor-containing material overlying a third light-emitting-diode (LED) chip configured to emit light of the first color, the third amount being different from the first amount and the second amount. Light from the third light-emitting device is characterized by a third point along the Planckian locus in the CIE chromaticity diagram. In some embodiments, in the first color is blue, the first phosphor is a red phosphor, and the second phosphor is a green phosphor. In an embodiment, the green phosphor has a peak emitting wavelength that is less than 550 nm. In another embodiment, the green phosphor has a peak emitting wavelength that is less than 525 nm. In some embodiment, the fixed ratio is a ratio of about one unit of red phosphor to 5-7 units of green phosphor.

While the invention has been described with respect to specific embodiments, one skilled in the art will recognize that numerous modifications are possible. For example, LED chips emitting different colors can be used with different combinations of phosphors. The methods described herein can be used select the type and quantity of phosphors to obtain a desirable light distribution.

Thus, although the invention has been described with respect to specific embodiments, it will be appreciated that the invention is intended to cover all modifications and equivalents within the scope of the following claims.

What is claimed is:

1. A method for fabricating light-emitting devices, the method comprising:
    obtaining a plurality of light-emitting diode (LED) chips fabricated to emit blue light;
    preparing a phosphor-containing material comprising a matrix material having dispersed therein a mixture of a red phosphor and a green phosphor, wherein the phosphor-containing material has about 60-80 units of red phosphor and 390-430 units of green phosphor; and
    disposing different thicknesses of the phosphor-containing material on different ones of the LED chips, wherein the LED chips having different thicknesses of the phosphor-containing material emit light characterized by different points along the Planckian locus in a CIE chromaticity diagram;
    combining two or more of the LED chips covered with different thicknesses of the phosphor-containing material to form an LED emitter, which emits light characterized by a point along the Planckian locus in the CIE chromaticity diagram.

2. The method of claim 1, wherein the green phosphor has a peak emitting wavelength that is less than 550 nm.

3. The method of claim 1, wherein the green phosphor has a peak emitting wavelength that is less than 525 nm.

4. The method of claim 1, wherein the green phosphor has a peak emitting wavelength in a range from about 515 nm to about 518 nm.

5. The method of claim 1, wherein the fixed ratio is a ratio of about one part of red phosphor to 5-7 parts of green phosphor by weight.

6. A method for fabricating light-emitting devices, the method comprising:
    obtaining a plurality of light-emitting diode (LED) chips fabricated to emit blue light;
    preparing a phosphor-containing material comprising a matrix material having dispersed therein a mixture of a red phosphor and a green phosphor, wherein the phosphor-containing material has about 60-80 units of red phosphor and 390-430 units of green phosphor, wherein LED chips having different thicknesses of the phosphor-containing material emit light characterized by an ellipse having a long axis substantially parallel to the Planckian locus in a CIE chromaticity diagram; and
    disposing different thicknesses of the phosphor-containing material on different ones of the LED chips, and
    combining two or more of the LED chips covered with different thicknesses of the phosphor-containing material to form an LED emitter.

7. The method of claim 1, wherein the phosphor-containing material has about 60-80 units of red phosphor and 390-430 units of green phosphor.

8. The method of claim 1, wherein the fixed ratio is a ratio of about one part of red phosphor to 5-7 parts of green phosphor by weight.

9. An LED (light-emitting-diode) emitter, comprising:
    a plurality of light-emitting-diode (LED) chips configured to emit blue light, wherein different ones of the LED chips have different thicknesses of a phosphor-containing material formed thereon, the phosphor-containing material comprising a matrix material having dispersed therein a mixture of a red phosphor and a green phosphor, wherein the phosphor-containing material has about 60-80 units of red phosphor and 390-430 units of green phosphor, wherein a distribution of light emitted from the plurality of LED chips having different thicknesses of the phosphor-containing material is characterized by an ellipse having a long axis substantially parallel to the Planckian locus in a CIE chromaticity diagram.

10. The plurality of light emitting devices of claim 9, wherein the green phosphor has a peak emitting wavelength that is 525 nm or less.

11. The plurality of light emitting devices of claim 9, wherein the green phosphor has a peak emitting wavelength in a range from about 515 nm to about 518 nm.

12. The plurality of light emitting devices of claim 9, wherein the fixed ratio is a ratio of about one unit of red phosphor to 5-7 units of green phosphor.

13. An LED (light-emitting-diode) emitter, comprising:
a first light-emitting device including a wavelength-conversion material having a first thickness overlying a first light-emitting-diode (LED) chip configured to emit light of a first color; and
a second light-emitting device including the wavelength-conversion material having a second thickness overlying a second light-emitting-diode (LED) chip configured to emit light of the first color, the second thickness being different from the first thickness;
wherein the wavelength-conversion material comprises a matrix material having dispersed therein a mixture of a first phosphor and a second phosphor, wherein the phosphor-containing material has about 60-80 units of red phosphor and 390-430 units of green phosphor; and
wherein the first light-emitting device and the first light-emitting device emit light characterized by different points along the Planckian locus in a CIE chromaticity diagram.

14. The plurality of light emitting devices of claim 13, further comprising a third light-emitting device including the phosphor-containing material having a third thickness overlying a third light-emitting-diode (LED) chip configured to emit light of the first color, the third thickness being different from the first thickness and the second thickness,
wherein light from the third light-emitting device is characterized by a third point along the Planckian locus in the CIE chromaticity diagram.

15. The plurality of light emitting devices of claim 13, wherein the first color is blue, the first phosphor is a red phosphor, and the second phosphor is a green phosphor.

16. The plurality of light emitting devices of claim 15, wherein the green phosphor has a peak emitting wavelength that is less than 525 nm.

17. The plurality of light emitting devices of claim 15, wherein the fixed ratio is a ratio of about one unit of red phosphor to 5-7 units of green phosphor.

* * * * *